(12) United States Patent
Yoon et al.

(10) Patent No.: US 11,195,449 B2
(45) Date of Patent: Dec. 7, 2021

(54) DISPLAY DEVICE

(71) Applicant: SAMSUNG DISPLAY CO., LTD., Yongin-si (KR)

(72) Inventors: Young-Soo Yoon, Seoul (KR); Yun-Kyeong In, Hwaseong-si (KR); Su Kyoung Kim, Hwaseong-si (KR); Won Se Lee, Seoul (KR); Dong Hyeon Jang, Hwaseong-si (KR); Yu-Jin Jeon, Hwaseong-si (KR); Hyun Ji Cha, Gwangju (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/913,371

(22) Filed: Jun. 26, 2020

(65) Prior Publication Data

US 2021/0097928 A1   Apr. 1, 2021

(30) Foreign Application Priority Data

Oct. 1, 2019  (KR) .................. 10-2019-0121680

(51) Int. Cl.
*G09G 3/00* (2006.01)
*G09G 3/20* (2006.01)
*H05K 9/00* (2006.01)

(52) U.S. Cl.
CPC ......... *G09G 3/2092* (2013.01); *H05K 9/0067* (2013.01); *G09G 2310/0275* (2013.01)

(58) Field of Classification Search
CPC ............... G09G 2330/04; G09G 3/006; G09G 2330/12; G09G 2330/10; G09G 2300/0413; G09G 2310/0286; G09G 2330/06; G09G 3/2092; G09G 2310/0275; G09G 2300/0426; G09G 3/20; H05K 9/0067

See application file for complete search history.

(56) References Cited

U.S. PATENT DOCUMENTS

| 9,299,281 B2* | 3/2016 | In .................. H01L 27/1255 |
| 2004/0100608 A1* | 5/2004 | Matsueda ......... G02F 1/136204 349/149 |
| 2008/0062373 A1* | 3/2008 | Kim .................. G02F 1/1345 349/151 |
| 2012/0249413 A1* | 10/2012 | Sugahara ............. G06F 3/0338 345/156 |

FOREIGN PATENT DOCUMENTS

| KR | 10-2002-0088450 | 11/2002 |
| KR | 10-2004-0085504 | 10/2004 |
| KR | 10-0539959 | 12/2005 |
| KR | 10-0539960 | 12/2005 |

(Continued)

*Primary Examiner* — Duc Q Dinh
(74) *Attorney, Agent, or Firm* — F. Chau & Associates, LLC

(57) ABSTRACT

A display device includes a substrate including a display area and a peripheral area disposed around the display area, a pad area disposed near an edge of the substrate, and a plurality of pads disposed in the pad area and arranged along the edge of the substrate. An end of a first pad, which is an outermost pad among the plurality of pads, is connected to a first end of a resistor. The first pad is disposed between the resistor and the edge of the substrate, and a second end of the resistor is connected to a wire.

13 Claims, 12 Drawing Sheets

(56) References Cited

FOREIGN PATENT DOCUMENTS

| | | |
|---|---|---|
| KR | 10-2006-0009636 | 2/2006 |
| KR | 10-0649559 | 11/2006 |
| KR | 10-2006-0125074 | 12/2006 |
| KR | 10-0903625 | 6/2009 |
| KR | 10-0911962 | 8/2009 |
| KR | 10-0943343 | 2/2010 |
| KR | 10-2011-0024152 | 3/2011 |
| KR | 10-1073215 | 10/2011 |
| KR | 10-1140166 | 4/2012 |
| KR | 10-1332088 | 11/2013 |
| KR | 10-2017-0077678 | 7/2017 |
| KR | 10-2018-0114565 | 10/2018 |

* cited by examiner

DISPLAY DEVICE

CROSS-REFERENCE TO RELATED APPLICATIONS

This application claims priority under 35 U.S.C. § 119 to Korean Patent Application No. 10-2019-0121680, filed in the Korean Intellectual Property Office on Oct. 1, 2019, the disclosure of which is incorporated by reference herein in its entirety.

TECHNICAL FIELD

The present invention relates to a display device.

DISCUSSION OF THE RELATED ART

Display devices, such as a liquid crystal display (LCD) device or an organic light emitting diode (OLED) display device, include a display panel including a plurality of pixels for displaying images and a plurality of signal lines. Each pixel may include a pixel electrode for receiving a data signal, and the pixel electrode may be connected to at least one transistor and may receive a data signal.

The display panel may include a display area in which images are displayed and a peripheral area disposed around the display area. A driving circuit for driving a display panel may be formed in the peripheral area, or a printed circuit film or a driving chip may be attached in the peripheral area. A pad area in which a plurality of pads are formed may be disposed on one edge of the peripheral area of the display panel. A printed circuit film or a driving chip may be attached to the pad of the pad area.

SUMMARY

Exemplary embodiments of the present invention prevent static electricity from being provided into a display panel through a pad of the display panel.

According to an exemplary embodiment, a display device includes a substrate including a display area and a peripheral area disposed around the display area, a pad area disposed near an edge of the substrate, and a plurality of pads disposed in the pad area and arranged along the edge of the substrate. An end of a first pad, which is an outermost pad among the plurality of pads, is connected to a first end of a resistor. The first pad is disposed between the resistor and the edge of the substrate, and a second end of the resistor is connected to a wire.

In an exemplary embodiment, the display device further includes a resistor pattern disposed on the substrate, and an insulating layer disposed on the resistor pattern and having an opening exposing the resistor pattern. The resistor includes the resistor pattern, and the first pad is disposed on the insulating layer and is electrically connected to the resistor pattern through the opening.

In an exemplary embodiment, the resistor pattern includes a semiconductor material.

In an exemplary embodiment, the resistor pattern has a polygonal shape in a plan view.

In an exemplary embodiment the display device further includes a plurality of gate lines disposed in the display area, and a gate driver disposed in the peripheral area and electrically connected to the plurality of gate lines. The gate driver includes a transistor, and the wire is electrically connected to the transistor.

In an exemplary embodiment, the display device further includes a plurality of data lines disposed in the display area, and a circuit portion disposed in the peripheral area and electrically connected to the plurality of data lines. The circuit portion includes a transistor, and the wire is electrically connected to a gate terminal of the transistor.

In an exemplary embodiment, the circuit portion is disposed between the pad area and the display area in a plan view.

In an exemplary embodiment, the display device further includes a plurality of data lines disposed in the display area, and a connection controller disposed in the peripheral area and electrically connected to the plurality of data lines. The connection controller includes a transistor, and the wire is electrically connected to a gate terminal of the transistor.

In an exemplary embodiment, the connection controller is disposed between the pad area and the display area in a plan view.

In an exemplary embodiment, the display device further includes a voltage line disposed in the peripheral area and which transmits a constant voltage. The plurality of pads further includes a second pad electrically connected to the voltage line.

In an exemplary embodiment, the second pad is disposed in a more outermost position than the first pad.

In an exemplary embodiment, a display device includes a substrate including a display area and a peripheral area disposed around the display area, a pad area disposed near an edge of the substrate, and a plurality of pads disposed in the pad area and arranged along the edge of the substrate. An end of a pad included in the plurality of pads is connected to a resistor, and the resistor is disposed between the end of the pad and the edge of the substrate.

In an exemplary embodiment, the display device further includes a resistor pattern disposed on the substrate, and an insulating layer disposed on the resistor pattern and having an opening exposing the resistor pattern. The resistor includes the resistor pattern, and the pad is disposed on the insulating layer and is electrically connected to the resistor pattern through the opening.

In an exemplary embodiment, the resistor pattern includes a semiconductor material.

In an exemplary embodiment, the resistor pattern meets the edge of the substrate.

In an exemplary embodiment, the resistor pattern is bent in a zigzag form.

In an exemplary embodiment, the resistor pattern includes a first resistor pattern and a second resistor pattern, the first resistor pattern is disposed between the pad and the edge of the substrate, and the second resistor pattern is connected to the first resistor pattern and overlaps the pad in a plan view.

According to an exemplary embodiment, a display device includes a substrate including a display area and a peripheral area disposed around the display area, a pad area disposed near an edge of the substrate, and a plurality of pads disposed in the pad area and arranged along the edge of the substrate. An end of a pad included in the plurality of pads is electrically connected to a resistor pattern disposed on the substrate, and the resistor pattern includes a portion disposed between the pad and the edge of the substrate.

In an exemplary embodiment, the resistor pattern includes a semiconductor material and is bent in a zigzag form.

In an exemplary embodiment, the resistor pattern meets the edge of the substrate.

According to exemplary embodiments of the present invention, static electricity may be prevented from being provided into the display panel through the pad(s) of the display panel.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
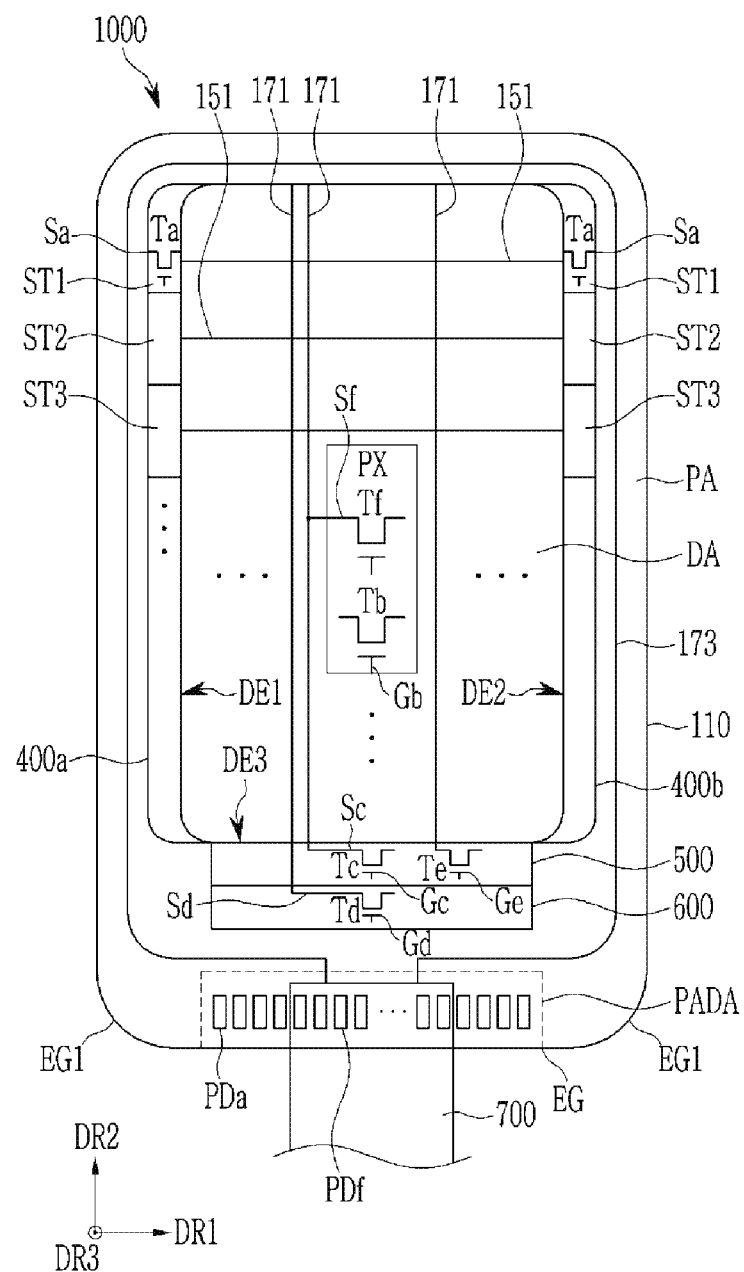
FIG. 1 shows a planar layout view of a display panel included in a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationship between elements should be interpreted in a like fashion.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Unless explicitly described to the contrary, the word "comprise" and variations such as "comprises" or "comprising" will be understood to imply the inclusion of stated elements but not the exclusion of any other elements.

Throughout the specification, a plane view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). Further, when two constituent elements overlap each other, it means that the two constituent elements overlap each other in the third direction (DR3), for example, in the direction that is perpendicular to an upper side of a substrate.

A display device according to an exemplary embodiment of the present invention will now be described with reference to FIGS. 1 to 4.

Figure 2:
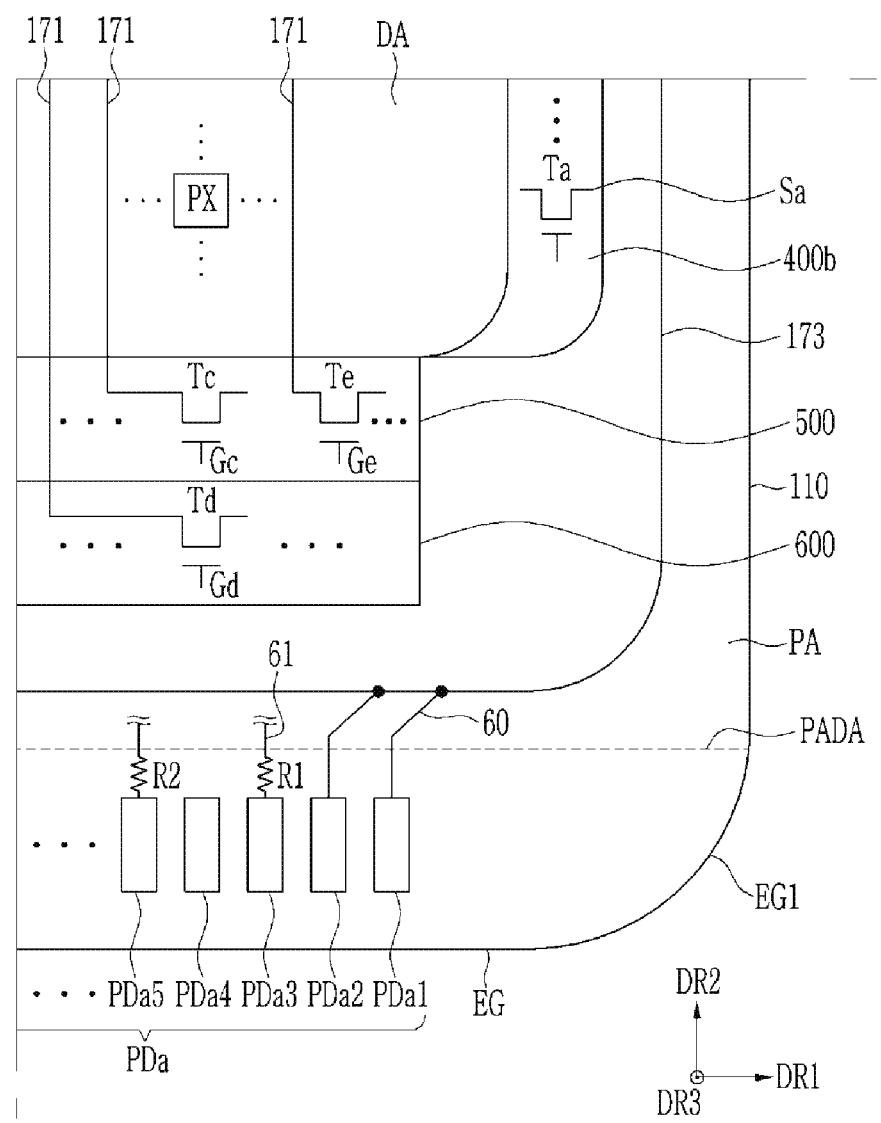
FIG. 2 shows a planar layout view of an edge portion of a display panel included in a display device according to an exemplary embodiment of the present invention.
Figure 3:
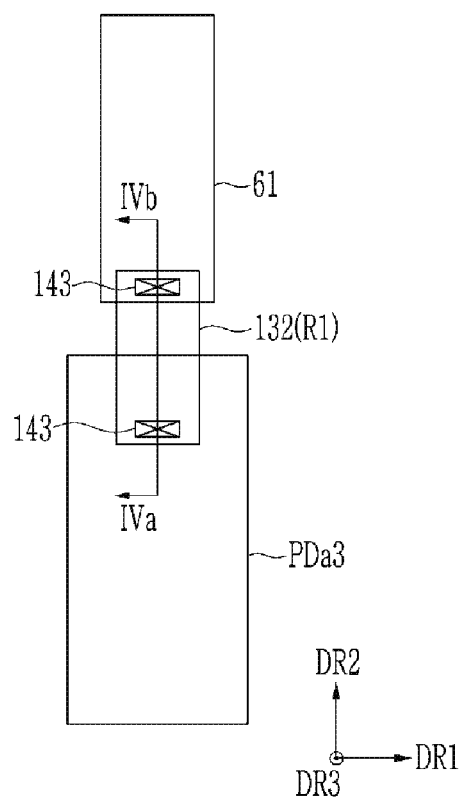
FIG. 3 shows a planar layout view of enlarged part of an edge portion of a display panel included in a display device according to an exemplary embodiment of the present invention.
Figure 4:
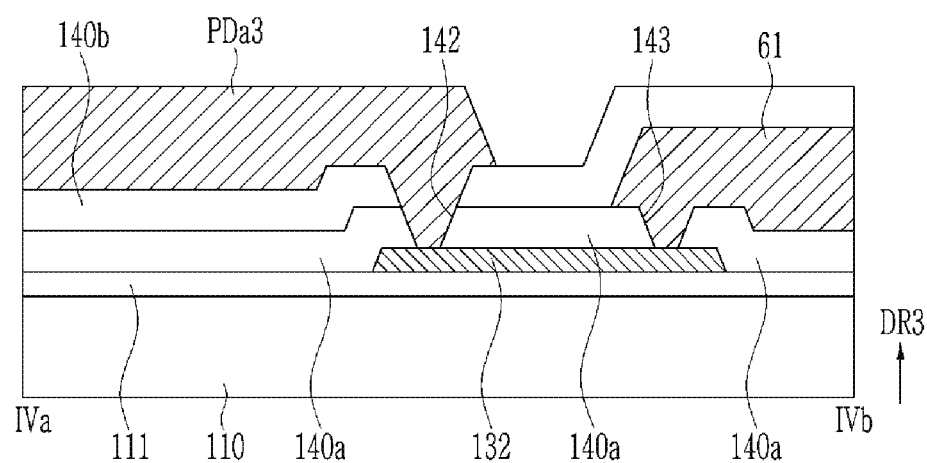
FIG. 4 shows a cross-sectional view of a display panel shown in FIG. 3 with respect to line Iva-Ivb.

FIG. 1 shows a planar layout view of a display panel included in a display device according to an exemplary embodiment of the present invention. FIG. 2 shows a planar layout view of an edge portion of a display panel included in a display device according to an exemplary embodiment of the present invention. FIG. 3 shows a planar layout view of an enlarged part of an edge portion of a display panel included in a display device according to an exemplary embodiment of the present invention. FIG. 4 shows a cross-sectional view of a display panel shown in FIG. 3 with respect to a line IVa-IVb.

The display device according to an exemplary embodiment of the present invention includes a display panel 1000 including a display area (DA) and a peripheral area (PA). The display panel 1000 includes a substrate 110.

The display area (DA) is a region in which a plurality of pixels PX are arranged to display images. Each pixel PX may include a pixel circuit including at least one transistor (e.g., Tb, Tf) and an emitter for displaying light.

A plurality of signal lines 151 and 171 may be disposed in the display area (DA). The signal lines 151 and 171 may include a gate line 151 for transmitting a gate signal and a data line 171 for transmitting a data signal. The gate line 151 may be electrically connected to a gate terminal (Gb) of one transistor (Tb) of the pixel circuit of the pixel PX. The data line 171 may be electrically connected to a source terminal (Sf) of one transistor (Tf) of the pixel circuit of the pixel PX. The transistor (Tf) may be different from the transistor (Tb), or may be an equivalent transistor depending on a structure of the pixel circuit.

Each gate line 151 may substantially extend in a first direction DR1, and each data line 171 may substantially extend in a second direction DR2 crossing the first direction DR1. For example, the first direction DR1 and the second direction DR2 may be substantially perpendicular to each other.

The peripheral area (PA) is a region in which an image is not displayed, and is disposed near the display area (DA). For example, the peripheral area (PA) may surround the display area (DA). The peripheral area (PA) may correspond to a bezel of a display device. However, the present invention is not limited thereto. For example, in an exemplary embodiment, at least part of the peripheral area (PA) may display an image.

The peripheral area (PA) may include gate drivers 400a and 400b, a connection controller 500, a circuit portion 600, and a pad area (PADA). According to exemplary embodiments, each of the gate drivers 400a and 400b, the connection controller 500, and the circuit portion 600 may be an electronic circuit.

The gate drivers 400a and 400b may be electrically connected to a plurality of gate lines 151, and may apply a plurality of gate signals to the plurality of gate lines 151. FIG. 1 exemplifies a case in which a first gate driver 400a is disposed on a left edge DE1 of the display area (DA) and a second gate driver 400a is disposed on a right edge DE2 of the display area (DA). The gate drivers 400a and 400b may generate a gate signal including a gate-on voltage and a gate-off voltage, and may apply the same to a plurality of gate lines 151, which extend in the first direction DR1 and are arranged in the second direction DR2.

The gate drivers 400a and 400b may include a plurality of stages (ST1, ST2, ST3, . . . ) dependently connected to each other and sequentially outputting the gate signals. The respective stages (ST1, ST2, ST3, . . . ) may include a transistor (Ta). The transistor (Ta) may include a source terminal (Sa) for receiving a start signal for instructing a start of operations of the stages (ST1, ST2, ST3, . . . ) or a carry signal from a previous stage.

A plurality of transistors (Ta) may be integrated with the substrate 110 in the same process when the transistors (Tb, Tf) included by the pixel circuit of the pixel PX are formed.

In an exemplary embodiment, one of the first and second gate drivers 400a and 400b may be omitted.

The connection controller 500 and the circuit portion 600 may be disposed on an outside of a lower edge DE3 of the display area (DA), and may be connected to the data lines 171. In an exemplary embodiment, the connection controller 500 and the circuit portion 600 may be disposed between the pad area (PADA) and the display area (DA). In an exemplary embodiment, the circuit portion 600 may be disposed in the peripheral area (PA) above the display area (DA).

The connection controller 500 may include a demultiplexer for selecting one of the data lines 171 and applying the data signal input from the outside. The connection controller 500 may include a plurality of transistors (Tc, Te) electrically connected to a plurality of data lines 171. The transistor (Tc) and the transistor (Te) may be electrically connected to different data lines 171. For example, the transistor (Tc) may include a source terminal (Sc) connected to a data line 171. A gate terminal (Gc) of the transistor (Tc) and a gate terminal (Ge) of the transistor (Te) may be connected to different control lines to receive different control signals, and may turn the transistor (Tc) on/off, thus allowing for the transistor (Te) to be controlled. The data line 171 to which the data signal is applied is selected from among the plurality of data lines 171 according to the on/off control of the transistor (Tc) and the transistor (Te), thus allowing for the data signal from a data driving circuit to be applied.

The circuit portion 600 may be a test circuit portion. For example, the circuit portion 600 may be a lighting test circuit portion for testing defects of the display area (DA). The circuit portion 600 may include a transistor (Td) electrically connected to one of the data lines 171. For example, the transistor (Td) may include a source terminal (Sd) connected to one of the data lines 171. A test signal may be applied to the data line 171 through the transistor (Td) in a stage for testing a defect of the display area (DA), and the display area (DA) may be tested to determine whether a defect is present based on a lighting state of the pixel PX connected to the data line 171.

The pad area (PADA) may include a plurality of conductive pads (PDa, PDf) disposed near an edge (EG) of the substrate 110 disposed near the lower edge DE3 of the display area (DA). The pads (PDa, PDf) may be arranged in parallel substantially in the first direction DR1 along the edge (EG) of the substrate 110, and may be arranged to form at least one row.

The display device according to an exemplary embodiment of the present invention may further include a driving circuit 700 attached and electrically connected to the pads (PDf) from among a plurality of pads (PDa, PDf). The driving circuit 700 may include at least one driving circuit chip such as, for example, a data driving circuit, a circuit film, or a circuit board. At least one driving circuit chip may be mounted on the circuit film or the circuit board.

A conductive adhesive film such as, for example, an anisotropic conductive film is disposed on a plurality of pads (PDf) so that the pads (PDf) may be electrically connected to the driving circuit 700. The conductive adhesive film may include an adhesive material and conductive particles.

The peripheral area (PA) may further include a voltage line 173 extending along a surrounding portion of the display area (DA). The voltage line 173 may receive a constant voltage from the driving circuit 700 through the pads (PDf).

According to an exemplary embodiment of the present invention, the plurality of pads (PDf) are attached and electrically connected to the driving circuit 700, and the plurality of pads (PDa) are not connected to the driving circuit 700 and are not covered with the driving circuit 700 and the conductive adhesive film. In this case, the pads (PDf) connected to the conductive adhesive film or the driving circuit 700 or covered by the same may be disposed in a center of the pad area (PADA), and the plurality of pads (PDa) not connected to the driving circuit 700 may be disposed on a right or a left side of the pads (PDf). For example, as shown in FIG. 1, the plurality of pads (PDa) may be disposed on right and left sides of the pad area (PADA), adjacent to the plurality of pads (PDf) disposed in the center of the pad area (PADA).

The pads (PDa) that are not covered by the driving circuit 700 and the conductive adhesive film may include a pad for contacting a test pin and inputting a test signal when the display panel 1000 is tested to determine whether a defect is present.

According to an exemplary embodiment of the present invention, differing from FIG. 1, the pads (PDa) may be connected to the conductive adhesive film and the driving circuit 700 in a like manner of the pads (PDf).

The edges of the substrate 110 may have round shapes at four corner portions. For example, a corner edge EG1 of the substrate 110 may have a round shape as shown above, and as a curvature of the corner edge EG1 increases, a distance between the corner edge EG1 and the pads (PDa) decreases.

Referring to FIG. 2, the plurality of pads (PDa) may sequentially include a first pad PDa1, a second pad PDa2, a third pad PDa3, a fourth pad PDa4, a fifth pad PDa5, . . . disposed in order from the pad disposed nearest to the corner edge EG1 of the substrate 110. For example, as the order progresses from the first pad PDa1, the second pad PDa2, the third pad PDa3, the fourth pad PDa4, the fifth pad PDa5, . . . , the pads (PDa) may approach the plurality of pads (PDf). The first pad PDa1, the second pad PDa2, the third pad PDa3, the fourth pad PDa4, the fifth pad PDa5, . . . may be arranged substantially in the first direction DR1.

FIG. 2 shows a bottom right portion of the display panel 1000. A bottom left portion of the display panel 1000 may have a form and a disposal that are symmetric with the configuration shown in FIG. 2.

The first pad PDa1 and the second pad PDa2 may be electrically connected to the voltage line 173 through a wire 60 and may receive a constant voltage.

The third pad PDa3 is the outermost disposed pad from among the plurality of pads (PDa) relative to the corner edge EG1 except for the first pad PDa1 and the second pad PDa2 connected to the voltage line 173. For example, among the plurality of pads (PDa), only the pads connected to the voltage line 173 (e.g., the first pad PDa1 and the second pad PDa2) may be disposed closer to the corner edge EG1 than the third pad PDa3.

An upper end of the third pad PDa3 is coupled in series to a resistor R1. For example, among a lower end of the third pad PDa3 disposed near the edge (EG) of the substrate 110 and the upper end of the third pad PDa3 disposed further from the edge (EG) of the substrate 110, the upper end is connected to the resistor R1. Thus, a lower end of the resistor R1 may be connected to the upper end of the third pad PDa3, and an upper end of the resistor R1 may be connected to one end of a wire 61. The other end of the wire 61 may be connected to different components of the display device, as described further below. The resistor R1 may have lower conductivity (e.g., higher resistance) than the third pad PDa3 and the wire 61.

The resistor R1 may include a material that has greater resistance than the third pad PDa3 and the wire 61. For example, the resistor R1 may include a semiconductor material such as amorphous silicon, polysilicon, or an oxide semiconductor.

Referring to FIGS. 3 and 4, a barrier layer 111, which is an insulating layer, may be disposed on the substrate 110, and a resistor pattern 132 included in the resistor R1 may be disposed on the barrier layer 111. The resistor pattern 132 may be disposed on the same layer as the active layer on which channel regions of the transistors Ta, Tb, Tc, Td, Te, and Tf included in the pixel PX, the gate drivers 400a and 400b, the connection controller 500, or the circuit portion 600 are formed. The resistor pattern 132 may include a semiconductor material having a carrier concentration that is similar to that of the channel region of the active layer or a carrier concentration that is similar to that of a conductive region of the active layer.

The resistor pattern 132 according to an exemplary embodiment may be in the shape of a polygon in a plan view such as, for example, a rectangle, as shown in FIG. 3. However, the shape of the resistor pattern 132 is not limited thereto. Resistance of the resistor R1 may be adjusted in various ways by controlling a length and/or a width of the resistor pattern 132 in a plan view. According to an exemplary embodiment, the resistor pattern 132 may be bent in a sinuous or zigzag from in a plan view.

Insulating layers 140a and 140b may be disposed on the resistor pattern 132. The insulating layers 140a and 140b may have an opening 142 exposing a portion of the resistor pattern 132. The insulating layer 140a may further have an opening 143 exposing another portion of the resistor pattern 132.

The third pad PDa3 may be disposed on the insulating layers 140a and 140b. The third pad PDa3 may be electrically connected to the resistor pattern 132 through the opening 142.

The wire 61 may be disposed between the insulating layer 140a and the insulating layer 140b in a cross-sectional view. The wire 61 may be electrically connected to the resistor pattern 132 through the opening 143.

At least one of the third pad PDa3 and the wire 61 may include at least one of metals including, for example, copper, aluminum, magnesium, silver, gold, platinum, palladium, nickel (Ni), neodymium, iridium, molybdenum, tungsten, titanium, chromium, tantalum, and alloys thereof.

An upper end of at least one pad from among the plurality of pads (PDa) (e.g., the fifth pad PDa5) disposed closer to the pads (PDf) compared to the third pad PDa3 may be coupled in series to a resistor R2. The resistor R2 may include a material having higher resistance than the pads (PDa). For example, the resistor R2 may include a semiconductor material such as amorphous silicon, polysilicon, or an oxide semiconductor. The resistor R2 may have a similar configuration to the above-described resistor R1.

In an exemplary embodiment, the resistor R2 may be omitted.

In an exemplary embodiment, at least one of the first pad PDa1 and the second pad PDa2 may be omitted. In this case, when both of the first pad PDa1 and the second pad PDa2 are omitted, the third pad PDa3 is the outermost disposed pad from among the plurality of pads (PDa) (e.g., relative to the corner edge EG1 of the substrate 110). For example, among all of the plurality of pads (PDa), the outermost third pad PDa3 may be disposed closest to the corner edge EG1 of the substrate 110. In this case, a first end of the outermost third pad PDa3 is connected to a first end of the first resistor R1, the outermost third pad PDa3 is disposed between the first resistor R1 and the edge (EG) of the substrate 110, and a second end of the first resistor R1 is connected to the wire 61.

Static electricity input from a display side of the display panel 1000 or the outside of the display panel 1000 may be input to the pads (PDa, PDf) through the edge (EG) of the substrate 110 or the corner edge EG1, and the static electricity input to the pads (PDa, PDf) may be input into the display panel 1000, which may damage electrical elements or wires. For example, as a curvature radius of the corner edge EG1 of the display panel 1000 increases, a distance between the corner edge EG1 and the pads (PDa) decreases, and as a result, the third pad PDa3, which is the outermost pad among the plurality of pads (PDa) (not including pads connected to the voltage line 173 such as pads PDa1 and PDa2), may be weaker with regard to the inputting of static electricity (e.g., the third pad PDa3 may be more susceptible to allowing the inflow of static electricity compared to other pads).

However, according to an exemplary embodiment of the present invention, the resistor R1 is connected to the upper end of the third pad PDa3 disposed to the right and left outermost portions in the pad area (PADA) (excluding the first and second pads PDa1 and PDa2 electrically connected to the voltage line 173 for transmitting a constant voltage), thereby preventing the static electricity from being input into the display panel 1000 through the third pad PDa3 disposed nearest to the corner edge EG1 of the substrate 110.

When the first and second pads PDa1 and PDa2 exist, the first and second pads PDa1 and PDa2 disposed nearest to the corner edge EG1 of the substrate 110 are connected to the voltage line 173 for transmitting a constant voltage, thereby dispersing the static electricity.

When the pads (PDa) from among a plurality of pads (PDa, PDf) are not connected to the conductive adhesive film or the driving circuit 700, the pads (PDa) are exposed to the outside, unlike the pads (PDf). As a result, the pads (PDa) may be weak with regard to the inflow of static electricity (e.g., the pads (PDa) may be more susceptible to allowing the inflow of static electricity compared to the pads (PDf)). However, according to an exemplary embodiment of the present invention, the inflow of static electricity into the display panel 1000 through the third pad PDa3 disposed nearest to the corner edge EG1 of the substrate 110 (not including pads connected to the voltage line 173, such as pads PDa1 and PDa2) may be prevented.

A display device according to an exemplary embodiment of the present invention will now be described with reference to FIGS. 5 to 7 together with the above-described drawings.

Figure 5:
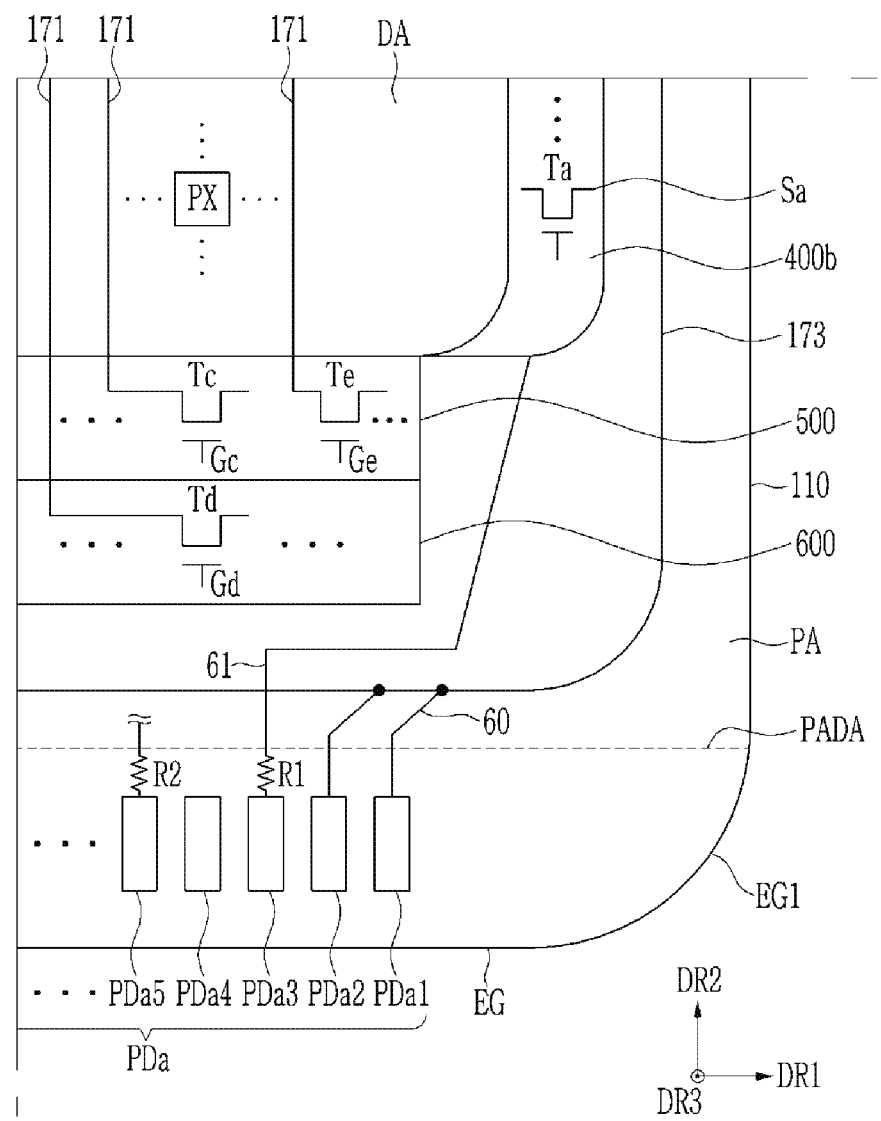
FIGS. 5, 6, 7 and 8 respectively show a planar layout view of an edge portion of a display panel included in a display device according to exemplary embodiments of the present invention.
Figure 6:
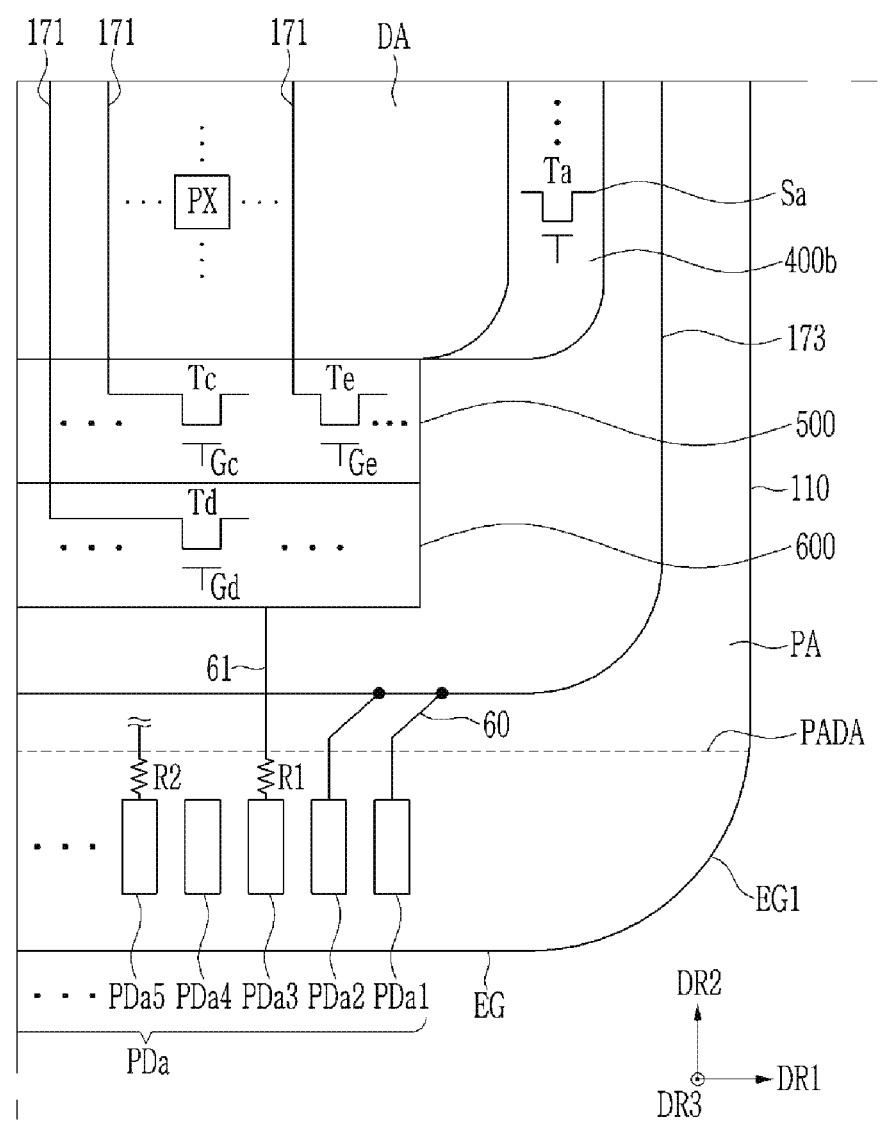
Figure 7:
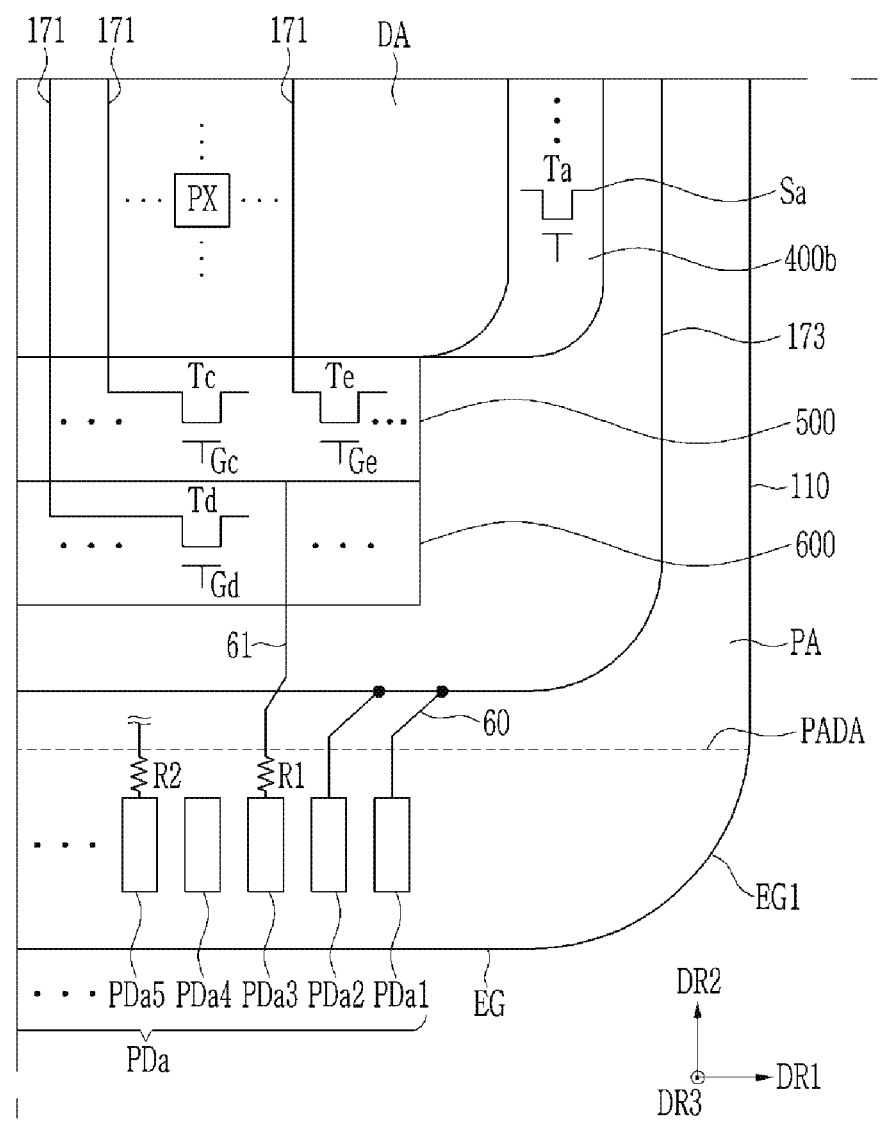

FIGS. 5 to 7 respectively show a planar layout view of an edge portion of the display panel 1000 included in a display device according to exemplary embodiments of the present invention.

FIGS. 5 to 7 show a bottom right portion of the display panel 1000 according to an exemplary embodiment of the present invention. A bottom left portion of the display panel 1000 may have a shape and a disposal that are symmetric with the configuration described with reference to FIGS. 5 to 7.

Referring to FIG. 5 together with FIG. 1, in a display device according to an exemplary embodiment, the wire 61 connected to the upper end of the resistor R1 connected to the third pad PDa3 may be electrically connected to the gate drivers 400a and 400b. For example, the wire 61 may be electrically connected to the source terminal (Sa) of the transistor (Ta) included in the first stage ST1 from among a plurality of stages (ST1, ST2, ST3, . . . ) included in the gate drivers 400a and 400b.

When a start signal is input to the third pad PDa3 in a stage for testing the display panel 1000, the first stage ST1 of the gate drivers 400a and 400b may output a first scan signal to the gate line 151 in response to the start signal. The first scan signal or the carry signal output in the first stage ST1 may be applied to the second stage ST2 as a start signal of the second stage ST2. In the above-noted way, a plurality of stages (ST1, ST2, ST3, . . . ) included in the gate drivers 400a and 400b may be sequentially driven to sequentially apply the scan signal to a plurality of gate lines 151.

Referring to FIG. 6 together with FIG. 1, in a display device according to an exemplary embodiment, the wire 61 connected to the upper end of the resistor R1 connected to the third pad PDa3 may be electrically connected to the circuit portion 600. For example, the wire 61 may be electrically connected to the gate terminal (Gd) of a plurality of transistors (Td) included in the circuit portion 600.

When a testing gate signal is input to the third pad PDa3 in a stage for testing the display panel 1000, the transistor (Td) of the circuit portion 600 may be turned on in response, and a test signal may be applied to the data line 171 connected to the transistor (Td) through the turned-on transistor (Td). A test may then be performed to determine whether the display panel 1000 has a defect in consideration of a lighting state of the pixel PX connected to the data line 171.

Referring to FIG. 7 together with FIG. 1, in a display device according to an exemplary embodiment, the wire 61 connected to the upper end of the resistor R1 connected to the third pad PDa3 may be electrically connected to the connection controller 500. For example, the wire 61 may be electrically connected to the gate terminal (Gc) of the transistor (Tc) included in the connection controller 500 or the gate terminal (Ge) of the transistor (Te).

When a control signal is input to the third pad PDa3 in a stage for testing the display panel 1000, the transistor (Tc) or the transistor (Te) of the connection controller 500 to which the control signal is applied is turned on, and a data signal may be applied to the data line 171 connected to the transistors (Tc, Te) through the turned-on transistors (Tc, Te). It may then be tested to determine whether the display panel 1000 has a defect in consideration of the lighting state of the pixel PX connected to the data line 171.

The signal applied to the third pad PDa3 disposed on the right and left outermost portions of the pad area (PADA) and not connected to the voltage line 173 may be a signal that has less of a flowing current than the signal applied to another pad PDa4 to which no resistor is connected from among the plurality of pads (PDa) and that controls whether to turn on/off the transistor or the driver. Therefore, when the resistor R1 is connected to the upper end of the third pad PDa3, a signal may be adequately applied through the third pad PDa3.

One of various signals applied to the above-noted third pad PDa3 may be applied to the fifth pad PDa5 connected to the resistor R2.

A display device according to an exemplary embodiment of the present invention will now be described with reference to FIGS. 8 to 10 together with the above-described drawings.

Figure 8:
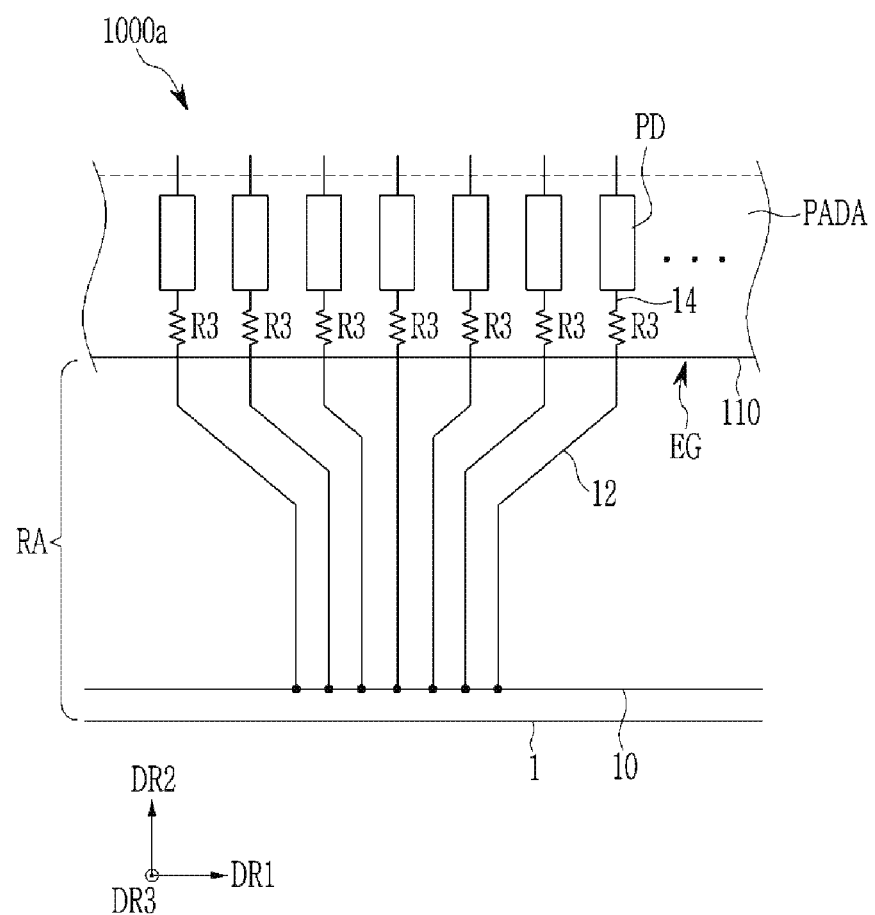

FIG. 8 shows a planar layout view of an edge portion of a display panel included in a display device according to an exemplary embodiment of the present invention. FIG. 9 shows a planar layout view of enlarged part of an edge portion of a display panel included in a display device according to an exemplary embodiment of the present invention. FIG. 10 shows a cross-sectional view of the display device shown in FIG. 9 with respect to line Xa-Xb.

Referring to FIG. 8, the display device according to an exemplary embodiment may include a display panel 1000a including a pad area (PADA) disposed near one edge (EG) of the substrate 110.

The pad area (PADA) includes a plurality of conductive pads (PD) arranged along the edge (EG) of the substrate 110. The plurality of pads (PD) may or may not be connected to at least one driving circuit chip such as, for example, a data driving circuit included in the display device according to an exemplary embodiment of the present invention, a circuit film, or a circuit board. For example, the plurality of pads (PD) may include a pad (PDa) or a pad (PDf) according to the above-described exemplary embodiments.

A lower end of at least one of the plurality of pads (PD) may be coupled in series to a resistor R3. For example, among an upper end and a lower end of at least one of the plurality of pads (PD), in which the lower end is disposed closer to the edge (EG) of the substrate 110 compared to the upper end, the lower end may be connected to the resistor R3. In an exemplary embodiment, each of the plurality of pads (PD) may be connected to a resistor R3, as shown in FIG. 8.

A wire 14 may be connected between the pad (PD) and the resistor R3. In an exemplary embodiment, the wire 14 may be omitted.

The resistor R3 may have lower conductivity (e.g., higher resistance) than the pad (PD) and the wire 14. The resistor R3 may be formed up to the edge (EG) of the substrate 110.

The resistor R3 may include a material with higher resistance than the pad (PD) and the wire 14. For example, the resistor R3 may include a semiconductor material such as amorphous silicon, polysilicon, or an oxide semiconductor.

According to an exemplary embodiment of the present invention, the resistor R3 is connected to the lower end of the pad (PD) of the pad area (PADA) disposed near the edge (EG) of the substrate 110. As a result, the inflow of static electricity provided from the display side of the display panel 1000a or the outside of the display panel 1000a may be prevented from being provided to the pad (PD) through the edge (EG) of the substrate 110. Accordingly, the inflow of static electricity into the display panel 1000a through the pad (PD) may be prevented, and damage of electrical elements or wires of the display panel 1000a by static electricity may be prevented.

Referring to FIG. 8, the display panel 1000a during the process for manufacturing a display device may further include a wire area (RA) disposed on a mother substrate 1 before the edge (EG) of the substrate 110 is cut. The wire area (RA) may be a region that is removed when the manufacturing process is completed.

The wire area (RA) may include a plurality of wires 12 electrically connected to the pads (PD), and a shorting bar 10. The shorting bar 10 may include a portion substantially extending in the first direction DR1. The shorting bar 10 may transmit a constant voltage such as, for example, a ground voltage. The wire 12 may include a same material as a resistor pattern 130 (see FIG. 9), and may include a conductive material that is different from that of the resistor pattern 130.

The plurality of wires 12 may be arranged in the first direction DR1.

Each of the wires 12 may start from the edge (EG) of the substrate 110 and may extend up to the shorting bar 10. The wire 12 may protect the pad (PD) from the static electricity by transmitting a constant voltage such as, for example, a ground voltage from the shorting bar 10 during the process for manufacturing the display panel 1000a. The upper end of the wire 12 may be electrically connected to the lower end of the resistor R3 near the edge (EG) of the substrate 110.

For the process for manufacturing the display panel 1000a, the inflow of static electricity into the pad (PD) by the resistor R3 may be prevented after the wire area (RA) is removed.

A plurality of pads (PD) may or may not have equivalent characteristics as the above-described pad (PDa) according to an exemplary embodiment.

Figure 9:
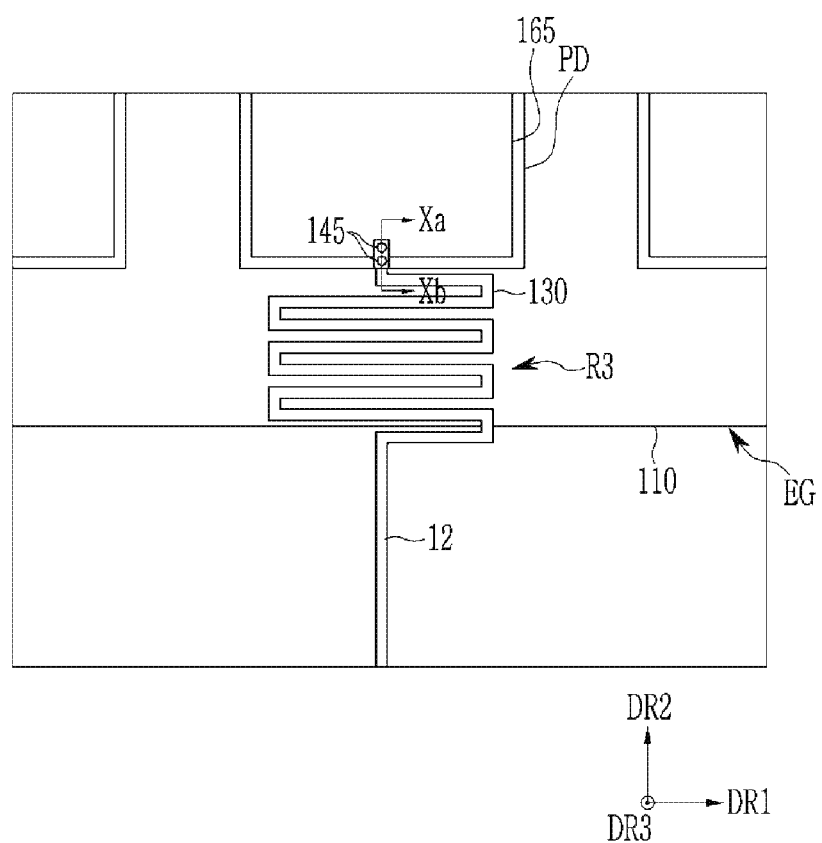
FIG. 9 shows a planar layout view of an enlarged part of an edge portion of a display panel included in a display device according to an exemplary embodiment of the present invention.
Figure 10:
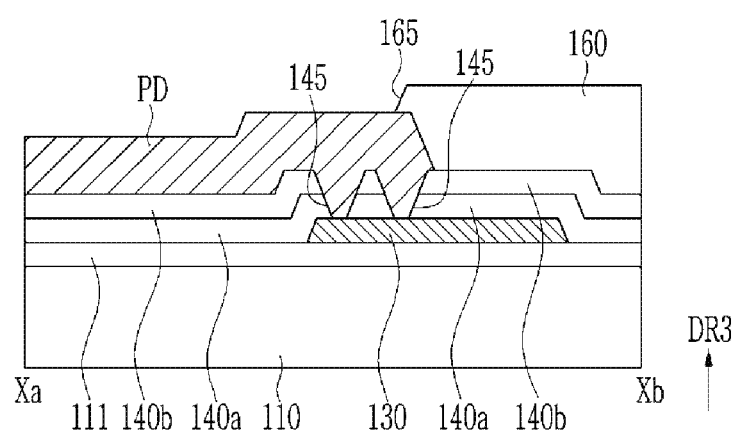
FIG. 10 shows a cross-sectional view of the display device shown in FIG. 9 with respect to line Xa-Xb.

Referring to FIGS. 9 and 10, a barrier layer 111, which is an insulating layer, may be disposed on the substrate 110, and a resistor pattern 130 included in the resistor R3 may be disposed on the barrier layer 111. The resistor pattern 130 may be disposed on the same layer as the active layer on which channel regions of the transistors Ta, Tb, Tc, Td, Te, and Tf included in the pixel PX, the gate drivers 400a and 400b, the connection controller 500, or the circuit portion 600 are formed. The resistor pattern 130 may include a semiconductor material including a similar carrier concentration to the channel region of the active layer or a similar carrier concentration to the carrier concentration of a conductive region of the active layer.

Referring to FIG. 9, resistance of the resistor R3 may be controlled in various ways by controlling a planar length and/or width of the resistor pattern 130. The resistor pattern 130 may be bent in a sinuous or zigzag form in a plan view, as shown in FIG. 9. The resistance of the resistor R3 may be controlled in various ways by controlling a bending degree and a number of bending times of the resistor pattern 130.

A lower end of the resistor pattern 130 may meet the edge (EG) of the substrate 110. For example, the lower end of the resistor pattern 130 may overlap the edge (EG) of the substrate 110 and terminate at or near the edge (EG) of the substrate 110.

Referring to FIG. 10, insulating layers 140a and 140b may be disposed on the resistor pattern 130. The insulating layers 140a and 140b may have an opening 145 exposing the resistor pattern 130.

A pad (PD) may be disposed on the insulating layers 140a and 140b. The pad (PD) may be electrically connected to the resistor pattern 130 through the opening 145.

The pad (PD) may include at least one of metals such as, for example, copper, aluminum, magnesium, silver, gold, platinum, palladium, nickel, neodymium, iridium, molybdenum, tungsten, titanium, chromium, tantalum, and alloys thereof.

An insulating layer 160 may be disposed on the pad (PD). The insulating layer 160 may have an opening 165 exposing an upper portion of the pad (PD).

The wire area (RA) disposed outside the edge (EG) of the substrate 110 shown in FIG. 9 may be removed in the process for manufacturing a display device. Accordingly, the wire 12 connected to the resistor R3 may be removed. However, the resistor R3 is connected between the pad (PD) and the edge (EG) of the substrate 110 after the wire area (RA) is removed. As a result, the static electricity input from the outside may be prevented from being transmitted to the pad (PD).

A display device according to an exemplary embodiment of the present invention will now be described with reference to FIGS. 11 and 12.

Figure 11:
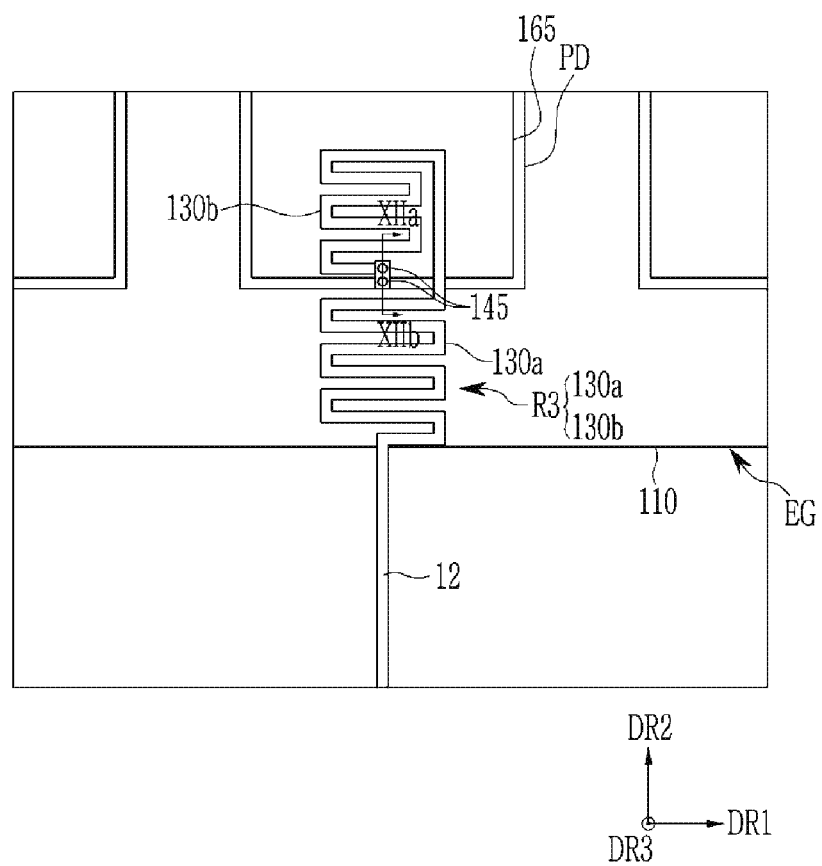
FIG. 11 shows a planar layout view of an enlarged part of an edge portion of a display panel included in a display device according to an exemplary embodiment of the present invention.

FIG. 11 shows a planar layout view of enlarged part of an edge portion of a display panel included in a display device according to an exemplary embodiment of the present invention. FIG. 12 shows a cross-sectional view of the display device shown in FIG. 11 with respect to line XIIa-XIIb.

Referring to FIG. 11, the display device according to an exemplary embodiment may be similar to the display device according to an exemplary embodiment described with reference to FIGS. 8 to 10, except that in FIG. 11, the resistor R3 may include resistor patterns 130a and 130b. The resistor patterns 130a and 130b may be disposed on the same layer as the active layer in a like manner of the resistor pattern 130.

The resistor pattern 130a may be disposed between the pad (PD) and the edge (EG) of the substrate 110 in a plan view, and the resistor pattern 130b may include a portion overlapping the pad (PD) in a plan view. The resistor pattern 130a is electrically connected to the resistor pattern 130b.

Figure 12:
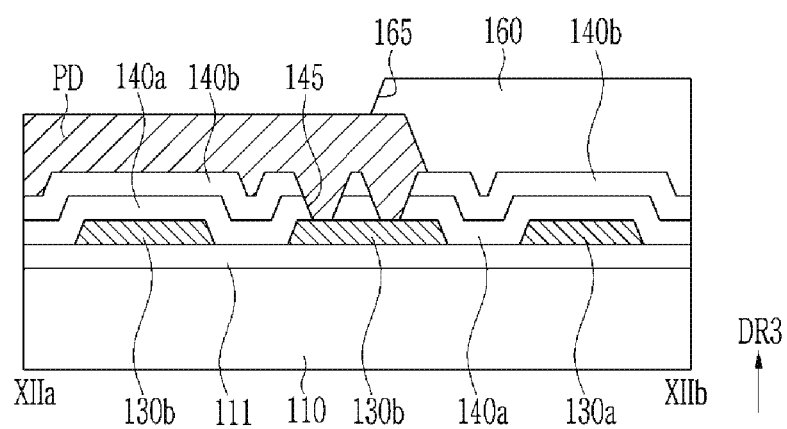
FIG. 12 shows a cross-sectional view of the display device shown in FIG. 11 with respect to line XIIa-XIIb.

Referring to FIG. 12, insulating layers 140a and 140b may be disposed on the resistor patterns 130a and 130b. The insulating layers 140a and 140b may have an opening 145 exposing the resistor pattern 130b.

A pad (PD) may be disposed on the insulating layers 140a and 140b. The pad (PD) may be electrically connected to the resistor pattern 130b through the opening 145.

An insulating layer 160 may be disposed on the pad (PD). The insulating layer 160 may have an opening 165 exposing the upper portion of the pad (PD).

The resistance of the resistor R3 may be controlled in various ways by controlling the planar length and/or width of the resistor patterns 130a and 130b. The resistor patterns 130a and 130b may be bent in a sinuous or zigzag form in a plan view, as shown in FIG. 11. The resistance of the resistor R3 may be controlled in various ways by controlling bending degrees and the number of bending times of the resistor patterns 130a and 130b.

The wire area (RA) disposed outside the edge (EG) of the substrate 110 shown in FIG. 11 may be removed during the process for manufacturing a display device. Accordingly, the wire 12 connected to the resistor R3 may be removed. However, the resistor R3 is connected between the pad (PD) and the edge (EG) of the substrate 110 after the wire area (RA) is removed. As a result, the static electricity provided from the outside may be prevented from being transmitted to the pad (PD). Further, the resistor pattern 130b may be formed to overlap the pad (PD). As a result, there may be increased ability to control resistance of the resistor R3 including the resistor patterns 130a and 130b.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
a substrate comprising a display area and a peripheral area disposed around the display area;
a pad area disposed near an edge of the substrate;
a plurality of pads disposed in the pad area and arranged along the edge of the substrate, wherein the plurality of pads includes a first group of pads and a second group of pads;
a driving circuit, which covers and is electrically connected to the first group of pads, and which does not cover and is not electrically connected to the second group of pads; and
a voltage line disposed in the peripheral area, which receives a constant voltage from the driving circuit through the first group of pads,
wherein a second pad, which is an outermost pad among the second group of pads, receives the constant voltage through the voltage line,
an end of a first pad among the second group of pads, which is disposed between the first group of pads and the second pad, is connected to a first end of a resistor,
the first pad is disposed between the resistor and the edge of the substrate, and
a second end of the resistor is connected to a wire.

2. The display device of claim 1, further comprising:
a resistor pattern disposed on the substrate; and
an insulating layer disposed on the resistor pattern and having an opening exposing the resistor pattern,
wherein the resistor comprises the resistor pattern, and
the first pad is disposed on the insulating layer and is electrically connected to the resistor pattern through the opening.

3. The display device of claim 2, wherein
the resistor pattern comprises a semiconductor material.

4. The display device of claim 2, wherein
the resistor pattern has a polygonal shape in a plan view.

5. The display device of claim 1, further comprising:
a plurality of data lines disposed in the display area; and
a connection controller disposed in the peripheral area and electrically connected to the plurality of data lines,
wherein the connection controller comprises a transistor, and
the wire is electrically connected to a gate terminal of the transistor.

6. The display device of claim 5, wherein
the connection controller is disposed between the pad area and the display area in a plan view.

7. A display device comprising:
a substrate comprising a display area and a peripheral area disposed around the display area;
a pad area disposed near an edge of the substrate;
a plurality of pads disposed in the pad area and arranged along the edge of the substrate,
wherein an end of a first pad, which is an outermost pad among the plurality of pads, is connected to a first end of a resistor,
the first pad is disposed between the resistor and the edge of the substrate, and
a second end of the resistor is connected to a wire;
a plurality of data lines disposed in the display area; and
a circuit portion disposed in the peripheral area and electrically connected to the plurality of data lines,
wherein the circuit portion comprises a transistor, and
the wire is electrically connected to a gate terminal of the transistor.

8. The display device of claim 7, wherein
the circuit portion is disposed between the pad area and the display area in a plan view.

9. A display device, comprising:
a substrate comprising a display area and a peripheral area disposed around the display area;
a pad area disposed near an edge of the substrate;
a plurality of pads disposed in the pad area and arranged along the edge of the substrate,
wherein an end of a pad included in the plurality of pads is connected to a resistor, and
the resistor is disposed between the end of the pad and the edge of the substrate;
a resistor pattern disposed on the substrate; and
an insulating layer disposed on the resistor pattern and having an opening exposing the resistor pattern,
wherein
the resistor comprises the resistor pattern,
the pad is disposed on the insulating layer and is electrically connected to the resistor pattern through the opening,
the resistor pattern comprises a first resistor pattern and a second resistor pattern,
the first resistor pattern is disposed between the pad and the edge of the substrate, and
the second resistor pattern is connected to the first resistor pattern and overlaps the pad in a plan view.

10. The display device of claim 9, wherein
the resistor pattern comprises a semiconductor material.

11. The display device of claim 9, wherein
the resistor pattern meets the edge of the substrate.

12. The display device of claim 9, wherein
the resistor pattern is bent in a zigzag form.

13. A display device comprising:
a substrate comprising a display area and a peripheral area disposed around the display area;
a pad area disposed near an edge of the substrate;
a plurality of pads disposed in the pad area and arranged along the edge of the substrate,
wherein an end of a first pad, which is an outermost pad among the plurality of pads, is connected to a first end of a resistor,
the first pad is disposed between the resistor and the edge of the substrate, and
a second end of the resistor is connected to a wire;
a plurality of gate lines disposed in the display area; and
a gate driver disposed in the peripheral area and electrically connected to the plurality of gate lines,
wherein the gate driver comprises a transistor, and
the wire is electrically connected to the transistor.

* * * * *